United States Patent [19]
Leighton et al.

[11] Patent Number: 5,933,327
[45] Date of Patent: Aug. 3, 1999

[54] WIRE BOND ATTACHMENT OF A INTEGRATED CIRCUIT PACKAGE TO A HEAT SINK

[75] Inventors: Larry C. Leighton, Scottsdale, Ariz.; Thomas W. Moller, Gilroy, Calif.; Bengt Ahl, Gavle, Sweden

[73] Assignee: Ericsson, Inc., Morgan Hill, Calif.

[21] Appl. No.: 09/054,973

[22] Filed: Apr. 3, 1998

[51] Int. Cl.[6] ...................................................... H05K 7/20
[52] U.S. Cl. ............................ 361/719; 257/785; 361/776
[58] Field of Search ..................................... 257/706, 707, 257/713, 784, 785; 165/80.3, 185; 174/16.3, 252; 361/704, 707, 709–712, 715, 722, 717–719, 761, 764, 776

[56] References Cited

U.S. PATENT DOCUMENTS

| | | |
|---|---|---|
| 3,757,271 | 9/1973 | Judge . |
| 5,198,964 | 3/1993 | Ito . |
| 5,450,288 | 9/1995 | Tanuma . |
| 5,497,031 | 3/1996 | Kozono . |
| 5,661,902 | 9/1997 | Katchmar . |
| 5,708,566 | 1/1998 | Hunninghaus . |
| 5,789,805 | 8/1998 | Kanekawa . |
| 5,812,375 | 9/1998 | Casperson . |
| 5,841,340 | 11/1998 | Passaro, Jr. et al. . |
| 5,869,897 | 2/1999 | Leighton et al. . |
| 5,877,555 | 3/1999 | Leighton . |

*Primary Examiner*—Gerald Tolin
*Attorney, Agent, or Firm*—Lyon & Lyon LLP

[57] ABSTRACT

A thermally conductive mounting flange of an IC package is placed directly on a heat sink surface between respective sections of single layer PC board attached to the heat sink, such that electrical leads extending from opposing sides of the package are positioned over corresponding conductive areas formed on the surface of the respective adjacent PC board section. The respective package leads are each connected to the corresponding PC board areas by one or more flexible bond wires. In addition to electrically connecting the package leads to the respective PC board sections, the bond wires collectively secure the package to the heat sink in a manner allowing for relative lateral movement between the respective flange and heat sink surfaces in response to thermal stresses.

6 Claims, 3 Drawing Sheets

WIRE BOND ATTACHMENT OF A INTEGRATED CIRCUIT PACKAGE TO A HEAT SINK

FIELD OF THE INVENTION

The present invention pertains to the field of integrated circuit packages and, in particular, to mounting arrangements for securing an integrated circuit package to a heat sink.

BACKGROUND

Integrated circuits ("ICs") have many uses in industries ranging from communications to consumer electronics. By way of example, a power transistor IC is formed by fabricating one or more transistor cells on a silicon wafer, commonly referred to as a transistor "chip". The transistor chip is attached to an insulating layer, normally a ceramic substrate, which is thermally, but not electrically, conductive. The ceramic substrate is itself attached to a thermally conductive mounting flange. A protective cover is secured to the flange, covering the substrate and transistor chip, thereby forming a power transistor IC "package."

Various electrically conductive (e.g., thin metal) leads may be attached to, and extend away from the package, in order to connect common terminals of the transistor chip to other circuit elements located, e.g., on an adjacent printed circuit ("PC") board. For example, with a bipolar junction type power transistor, respective electrical leads attached to the package are connected to a base, emitter and collector of the transistor chip.

Because the power transistor package generates a significant amount of heat during operation, the bottom surface of the package mounting flange is normally directly secured to a metallic heat sink underlying the PC board. For example, a single layer PC board has a layer of dielectric material between respective top and bottom conductive surfaces, wherein the bottom surface acts as a reference ground. This bottom surface is connected, usually with screws or solder, to the underlying metal heat sink, so that the bottom surface and the heat sink have the same ground potential with respect to any circuit elements attached to the top surface of the PC board.

There are several known techniques for securing an IC package to a heat sink surface. For example, as illustrated in FIG. 1, an exemplary IC package 20 may be secured to a heat sink 22 by a solder connection 28 between the bottom surface of the package mounting flange 26 and the surface of the heat sink 22.

While this approach is relatively simple, the solder weld material 28 will invariably have a different thermal expansion coefficient than the respective (typically metal) mounting flange 26 and heat sink 22. As a result, the bond between the mounting flange 26 and heat sink 22 will weaken or even be destroyed by the thermal expansion stress between the respective layers, especially when subjected to repeated changes in temperature during each use of the IC package 20. Further, the presence of the intervening bonding material layer 28 may lesson the effectiveness of the heat conduction between the flange 26 and heat sink 22. A still further disadvantage with this approach is that, in order to remove the IC package 20 for repair or replacement, the entire heat sink 22 must be heated to break the solder bond 28, thereby causing any other solder bonds on the same heat sink 22 to be weakened.

Referring to FIG. 2, as an alternative to using a solder connection, the IC package 20 may be secured to the heat sink 22 with a pair of screws 24 through openings located on respective ends of the mounting flange 26. Referring to FIGS. 3 and 4, still another technique for securing an IC package to a heat sink is to insert one or more screws 30 into, so as to be protruding above, the surface of the heat sink 22. A resilient metal strip 32 is extended from the screw(s) 30 and is shaped so as to apply a clamping force upon the cover of the IC package 20, thereby distributing a substantially centered force that "secures" the mounting flange 26 against the heat sink 22.

Still another method for securing an IC package to a heat sink is disclosed and described in pending U.S. patent application Ser. No. 08/956,193, now U.S Pat. 5869897, entitled, "Mounting Arrangement For Securing An Integrated Circuit Package To A Heat Sink," which is fully incorporated herein by reference for all it teaches. As taught therein, and as illustrated in FIG. 5, a top surface 52 of a protective cover 50 of an IC component package 40 is provided with a centered-protrusion 54. A resilient retaining-spring 46 formed into a ribbon-like shape having opposing ends 56 and 58 that extend from a curvelinear bottom surface 60 is provided with an opening 62 sized to mate with the centered protrusion 54.

To mount the IC package 40 to a heat sink 42, the retaining-spring opening 62 is compressively mated onto the package cover protrusion 54 as the mounting flange 45 of the IC package 40 is inserted between substantially parallel walls 44 and 48 protruding from the heat sink 42, such that the opposing retaining-spring ends 56 and 58 extend away from the package cover 50 at substantially the same, albeit reverse angles. The walls 44 and 48 are distanced from each other just so as to cause moderate compression of the opposing retaining-spring ends 56 and 58 toward each other as the flange 45 is inserted against the heat sink 42.

The walls 44 and 48 are each provided with a respective plurality of notches 64 and 68, which extend substantially parallel to the heat sink 42 in a "ratchet-type" relief pattern. Once the mounting flange 45 is pressed against the heat sink 42, the opposing spring ends 56 and 58 are retained in place by the respective wall notches 64 and 68. In this manner, the spring 46 applies a retaining force against the package cover 50, thereby securing the mounting flange 45 against the heat sink 42, as indicated by the arrow 70.

With any of the above-illustrated methods for securing an IC package to a heat sink, once the IC package is secured to the heat sink, electrical leads extending from the package (not shown in FIGS. 1–5) must be connected to respective conductive surface leads or areas, e.g., located on an adjacent PC board attached to the heat sink.

By way of illustration, referring to FIG. 6, the mounting flange 86 of an IC package 80 is mounted on a heat sink 82 via a conventional solder weld 84. A single layer PC board 88 is also secured to the heat sink 82, e.g., by screws (not shown) adjacent both sides of the package 80. The PC board includes a metal top surface 90, a layer of dielectric material 92, and a metal bottom surface 94, respectively, wherein the bottom surface 94 and attached heat sink 82 collectively act as a reference ground with respect to circuit elements (not shown) attached to the top surface of the PC board 88. Respective leads 96 and 98 extend from opposite sides of the package 80 and are connected to corresponding conductive paths formed on the top surface 90 of the PC board 88 via respective solder welds 100 and 102.

As with the problems of using a solder weld connection between the respective package flange (28) and heat sink (22) described above in conjunction with FIG. 1, the solder weld connections 100 and 102 are also prone to problems caused by different thermal expansion coefficients between the solder material, the conductive surface 90, and the respective (metal) leads 96 and 98. In particular, the solder material can crystallize after repeated heating and cooling, causing welds 100 and 102 to weaken and/or fail, with the respective leads 96 and 98 lifting and separating from the surface 90 of the PC board 88.

Thus, it would be desirable to provide improved arrangements for securing an IC component package to a heat sink, whereby solder-welds are eliminated.

SUMMARY OF THE INVENTION

The present invention provides improved arrangements for securing an IC component package to a heat sink in a manner which provides for the non-solder-based connection of leads extending from the package to respective conductive pathways located on an adjacent PC board surface.

In a preferred embodiment, a thermally conductive mounting flange of an IC package is placed directly on a heat sink surface between respective sections of single layer PC board attached to the heat sink, such that electrical leads extending from opposing sides of the package are positioned over corresponding conductive areas formed on the surface of the respective adjacent PC board section. In accordance with a first aspect of the invention, the respective package leads are each connected to the corresponding PC board areas by one or more flexible bond wires. In addition to electrically connecting the package leads to the respective PC board sections, the bond wires collectively secure the package to the heat sink in a manner allowing for lateral movement between the respective flange and heat sink surfaces in response to thermal stresses.

As will be apparent to those skilled in the art, other and further objects and advantages will appear hereinafter.

BRIEF DESCRIPTION OF THE DRAWINGS

The drawings illustrate both the design and utility of the present invention, in which similar elements in different embodiments are referred to by the same reference numbers for purposes of ease in illustration, in which.

DETAILED DESCRIPTION OF THE PREFERRED EMBODIMENTS

Figure 1:
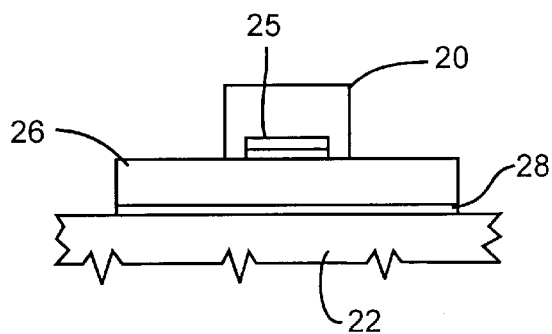
FIG. 1 is a side view of a first prior art mounting arrangement, wherein an IC package is soldered or otherwise bonded to a heat sink.
Figure 2:
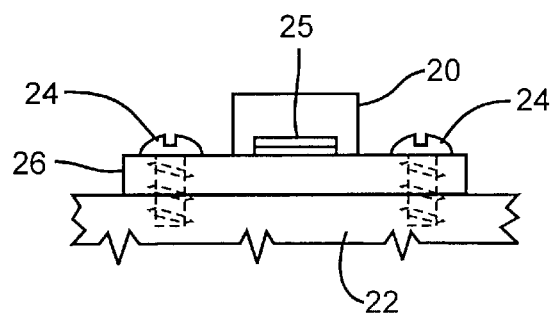
FIG. 2 is a partial cut-away side view of a second prior art mounting arrangement, wherein mounting screws are employed for directly attaching an IC package to a heat sink.
Figure 3:
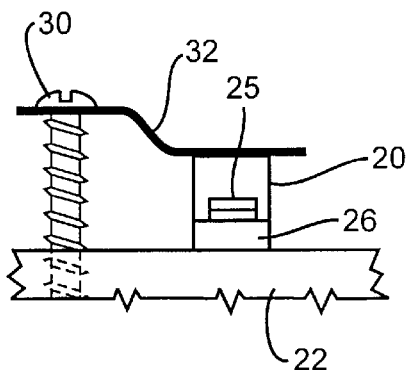
FIG. 3 is a side view of a third prior art mounting arrangement, wherein a single retaining screw and retaining strip extending therefrom are used to secure an IC package to a heat sink.
Figure 4:
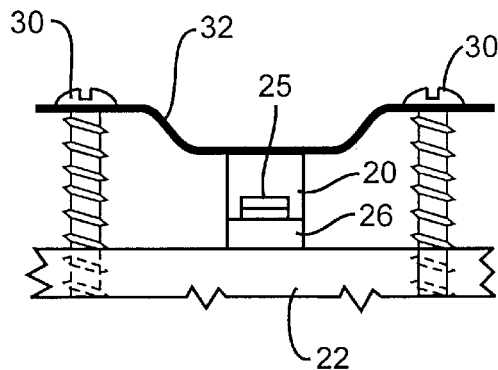
FIG. 4 is an side view of a fourth prior art mounting arrangement, wherein a pair of retaining screws and a retaining strip extended therebetween are used to secure an IC package to a heat sink.
Figure 5:
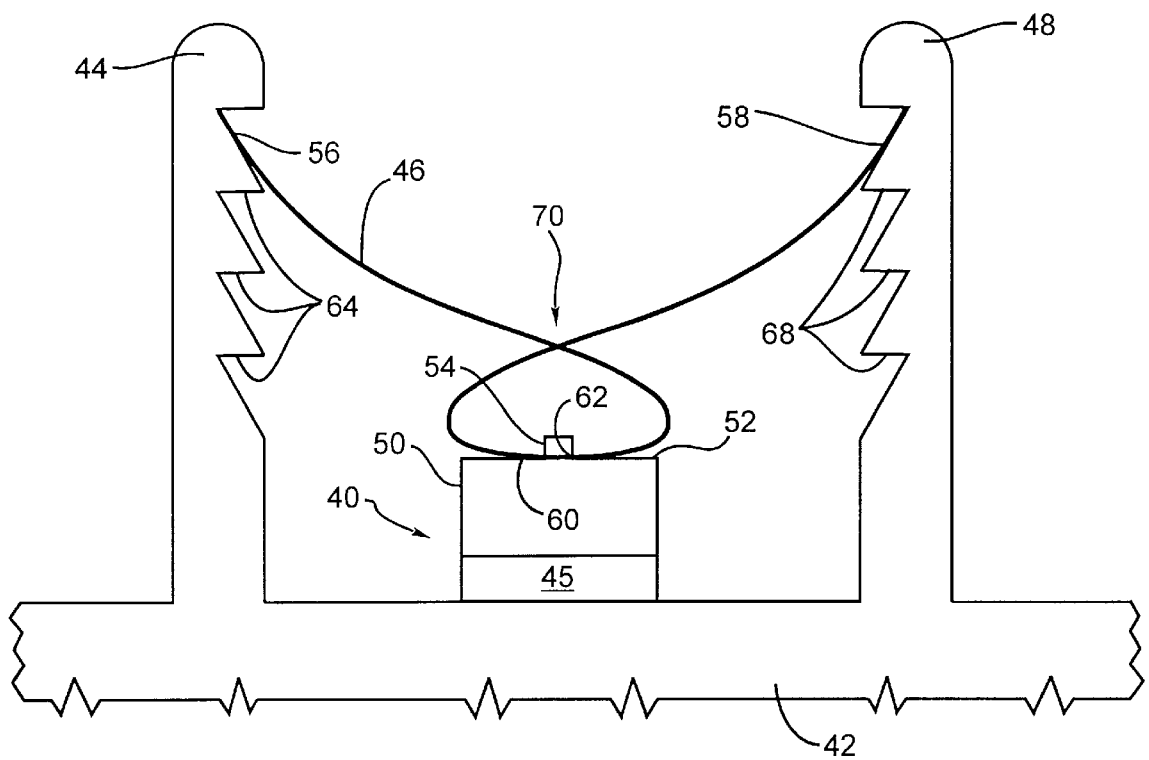
FIG. 5 is a partial cut-away side view of a still further arrangement for mounting an IC package to a heat sink, wherein a resilient, ribbon-shaped retaining-spring is affixed to the center of a protective cover of the package and held in place by a pair of opposing walls protruding from the heat sink.
Figure 6:
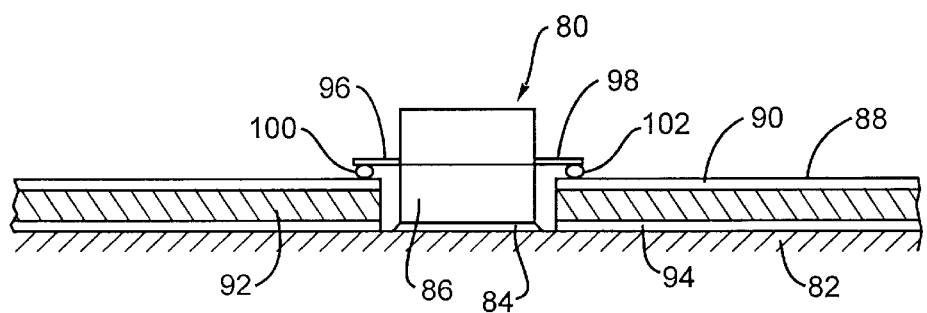
FIG. 6 is a partial cut-away side view of an IC package solder bonded to a heat sink, whereby conductive surface leads on an adjacent PC board are connected to respective leads extending from the package via a prior art solder weld connections.
Figure 7:
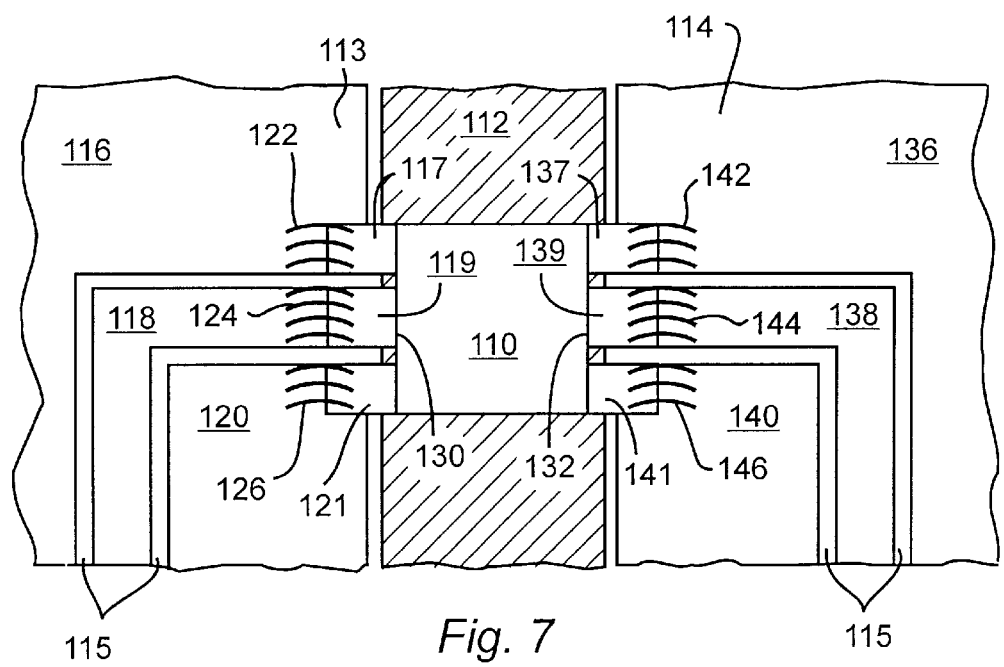
FIG. 7 is a top view of a preferred power transistor package attached to a heat sink by a plurality of flexible bond wires connecting respective leads extending from the package to conductive areas formed on adjacent PC board sections attached to the heat sink.

Referring to FIG. 7, a power transistor package 110 is positioned on a heat sink 112 between first and second sections 113 and 114 of single layer PC board attached to the heat sink 112. The transistor package 110 includes a first plurality of leads 117, 119 and 121 attached to one side 130, and a second plurality of leads 137, 139 and 141 attached to an opposite side 132. In particular, the package 110 is positioned on the heat sink 112 such that the electrical leads 117, 119 and 121 on the first side 130 extend over corresponding conductive areas 116, 118 and 120 formed on the surface of the first PC board section 113, and the electrical leads 137, 139 and 141 on the opposite side 132 extend over corresponding conductive areas 136, 138 and 140 formed on the surface of the second PC board section 114, respectively.

In a preferred embodiment, the conductive areas 116, 118, 120, 136, 138 and 140 are formed by selectively removing a portion of the conductive (i.e., metallic) top surface of the respective first and second PC board sections 113 and 114 to thereby expose the underlying dielectric material 115. The exposed areas of dielectric material 115 act as a non-conductive boundaries defining the respective conductive areas 116, 118, 120, 136, 138 and 140.

The transistor package leads 117, 119, 121, 137, 139 and 141 are connected to the corresponding conductive PC board areas 116, 118, 120, 136, 138 and 140 by respective pluralities of resilient, conductive bond wires 122, 124, 126, 142, 144 and 146. The bond wires 122, 124, 126, 142, 144 and 146, which are preferably made of suitable material, such as aluminum, gold or an aluminum alloy, electrically couple the package leads 117, 119, 121, 137, 139 and 141 to the respective conductive PC board areas 116, 118, 120, 136, 138 and 140, while collectively securing the package 110 to the heat sink 112.

More particularly, the respective pluralities of bond wires 122, 124, 126, 142, 144 and 146 are bonded on one end to the respective conductive PC board areas 116, 118, 120, 136, 138 and 140, and at the other end to the respective package leads 117, 119, 121, 137, 139 and 141. The individual bond wires are preferably attached to the respective conductive areas and package leads via conventional means, such as known ultrasonic wire bonding techniques.

Figure 8:
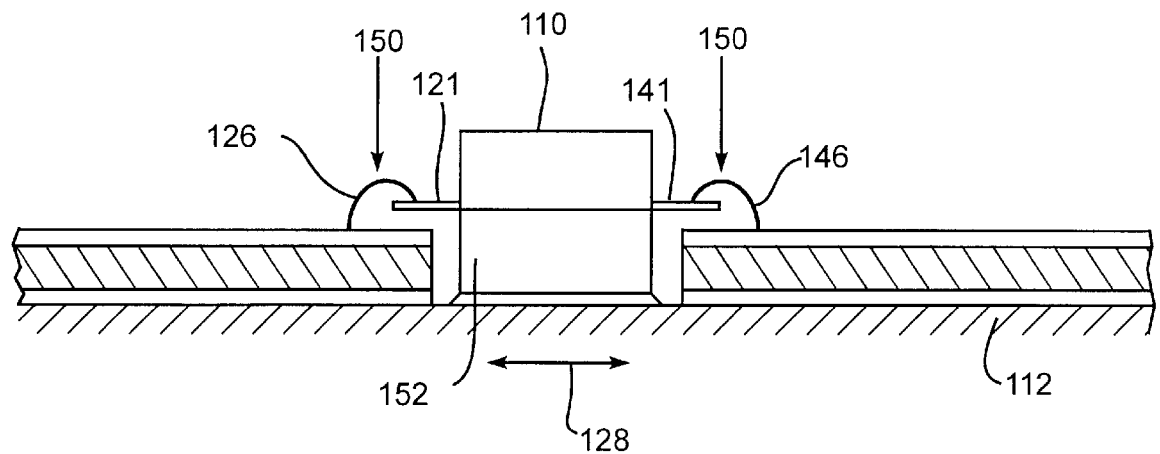
FIG. 8 is a partial cut-away side view of the arrangement of FIG. 7.

As best seen in FIG. 8, the resilience of the wires provides a force against the respective package leads in the direction indicated by the arrows 150, thereby pressing a mounting flange 152 underlying the transistor package 110 flush against the heat sink 112. Because the package flange 152 is not affixed in place, the illustrated mounting configuration allows for the package 110 to move laterally relative to the heat sink 112, as indicated by the arrows 128, to avoid any thermal stresses that may otherwise result. Further, at least one advantage of employing bond wires to connect the package leads 117, 119, 121, 137, 139 and 141 to the respective conductive PC board areas 116, 118, 120, 136, 138 and 140 is that solder connections are not needed.

Thus, preferred embodiments have been disclosed of an improved mounting arrangement for securing a IC package to a heat sink. While embodiments and applications of this invention have been shown and described, as would be apparent to those skilled in the art, many more modifications and applications are possible without departing from the inventive concepts herein.

The scope of the invention, therefore, are not to be restricted except in the spirit of the appended claims.

What is claimed:

1. An electrical assembly, comprising:

an integrated circuit package including a mounting flange and an electrical lead, the electrical lead attached to, and extending away from, the package;

a heat sink, the mounting flange in direct contact with the heat sink;

a conductive surface attached to the heat sink adjacent the integrated circuit package; and a plurality of resilient, conductive wires attached at one end to the conductive surface and at another end to the electrical lead, the wires securing the mounting flange against the heat sink.

2. The electrical assembly of claim 1, wherein the conductive surface comprises a single layer PC board.

3. The electrical assembly of claim 1, wherein the mounting flange is laterally movable relative to the heat sink.

4. An electrical circuit assembly, comprising:

an integrated circuit package, the package including a mounting flange, a first electrical lead attached to, and extending away from, a first side of the package, and a second electrical lead attached to, and extending away from, a second side of the package;

a heat sink, the mounting flange positioned in direct contact with the heat sink;

a first conductive surface attached to the heat sink adjacent the first side of the package;

a second conductive surface attached to the heat sink adjacent the second side of the package;

a first plurality of resilient, conductive wires attached at one end to the first conductive surface and at another end to the first electrical lead; and a second plurality of resilient, conductive wires attached at one end to the second conductive surface and at another end to the second electrical lead, the first and second plurality of wires movably securing the mounting flange against the heat sink.

5. The electrical assembly of claim 4, wherein the first and second conductive surfaces each comprise a single layer PC board.

6. The electrical assembly of claim 4, wherein the mounting flange is laterally movable relative to the heat sink.

* * * * *